US010793711B2

(12) United States Patent
Lee et al.

(10) Patent No.: US 10,793,711 B2
(45) Date of Patent: Oct. 6, 2020

(54) EPOXY RESIN COMPOSITION FOR SEALING SEMICONDUCTOR DEVICE, AND SEMICONDUCTOR DEVICE SEALED USING SAME

(71) Applicant: SAMSUNG SDI CO., LTD., Yongin-si, Gyeonggi-do (KR)

(72) Inventors: Yoon Man Lee, Suwon-si (KR); Jae Hyun Kim, Suwon-si (KR); Tae Shin Eom, Suwon-si (KR); Eun Jung Lee, Suwon-si (KR); Su Mi Im, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/301,509

(22) PCT Filed: Feb. 15, 2017

(86) PCT No.: PCT/KR2017/001662
§ 371 (c)(1),
(2) Date: Nov. 14, 2018

(87) PCT Pub. No.: WO2017/217638
PCT Pub. Date: Dec. 21, 2017

(65) Prior Publication Data
US 2019/0292363 A1  Sep. 26, 2019

(30) Foreign Application Priority Data

Jun. 17, 2016 (KR) ........................ 10-2016-0076003

(51) Int. Cl.
*C08J 3/12* (2006.01)
*C08L 63/00* (2006.01)
(Continued)

(52) U.S. Cl.
CPC .............. *C08L 63/00* (2013.01); *C08G 59/02* (2013.01); *C08J 3/12* (2013.01); *C08J 3/20* (2013.01);
(Continued)

(58) Field of Classification Search
CPC .... C08G 59/02; C08J 3/12; C08J 3/20; C08K 3/36; H01L 23/295; H01L 33/56; C08L 63/00; C08L 2203/206; C08L 2205/025
(Continued)

(56) References Cited

U.S. PATENT DOCUMENTS 5,698,152 A    12/1997  Taruno et al.
6,054,222 A     4/2000  Takami et al.

FOREIGN PATENT DOCUMENTS

CN      102558769 A    7/2012
CN      103897342 A    7/2014
(Continued)

OTHER PUBLICATIONS

Chinese Office Action dated Jun. 8, 2020 in the corresponding Chinese Patent Application No. 201780037338.6.

*Primary Examiner* — David T Karst
(74) *Attorney, Agent, or Firm* — Lee IP Law, P.C.

(57) ABSTRACT

The present invention relates to an epoxy resin composition for sealing a semiconductor device, a preparation method therefor, and a semiconductor device sealed by using the same, the epoxy resin composition, which comprises an epoxy resin, a curing agent, an inorganic filler, and one or more additives selected from the group consisting of a curing accelerator, a coupling agent, a release agent, and a colorant, and has a gel content of approximately 1 ppm or less.

11 Claims, 3 Drawing Sheets

(51) Int. Cl.
*C08K 3/36* (2006.01)
*H01L 23/29* (2006.01)
*H01L 33/56* (2010.01)
*C08J 3/20* (2006.01)
*C08G 59/02* (2006.01)

(52) U.S. Cl.
CPC .............. *C08K 3/36* (2013.01); *H01L 23/295* (2013.01); *H01L 33/56* (2013.01); *C08L 2203/206* (2013.01); *C08L 2205/025* (2013.01)

(58) Field of Classification Search
USPC ........................................................ 523/427
See application file for complete search history.

(56) References Cited

FOREIGN PATENT DOCUMENTS

| | | |
|---|---|---|
| CN | 108140635 A | 6/2018 |
| JP | H10-292094 A | 11/1998 |
| JP | 2002-327044 A | 11/2002 |
| JP | 4618056 B2 | 1/2011 |
| KR | 10-0287491 B1 | 1/2001 |
| KR | 10-2009-0082141 A | 7/2009 |
| KR | 10-2013-0114113 A | 10/2013 |

[FIG. 1]
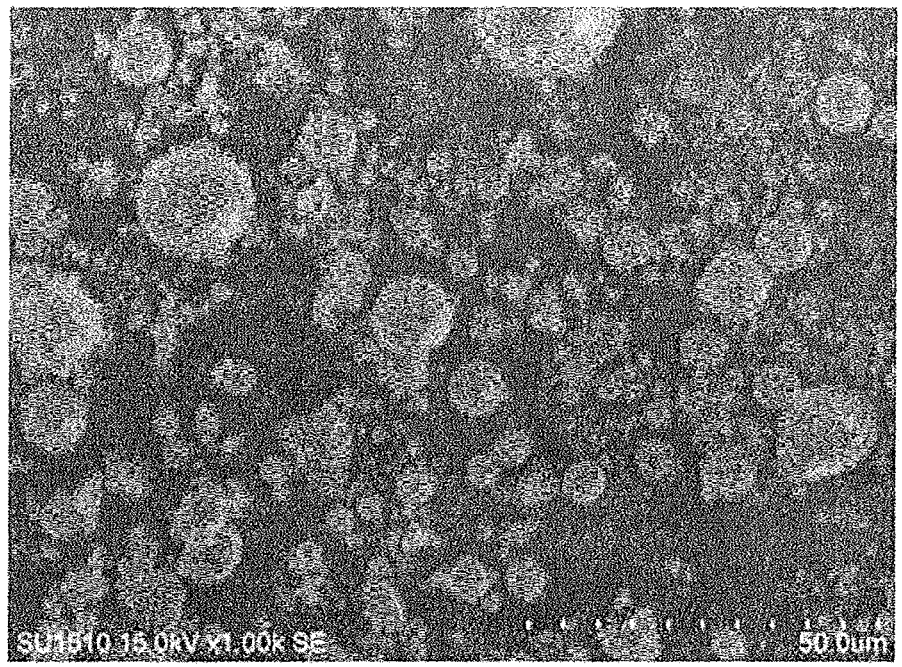
[FIG. 2]
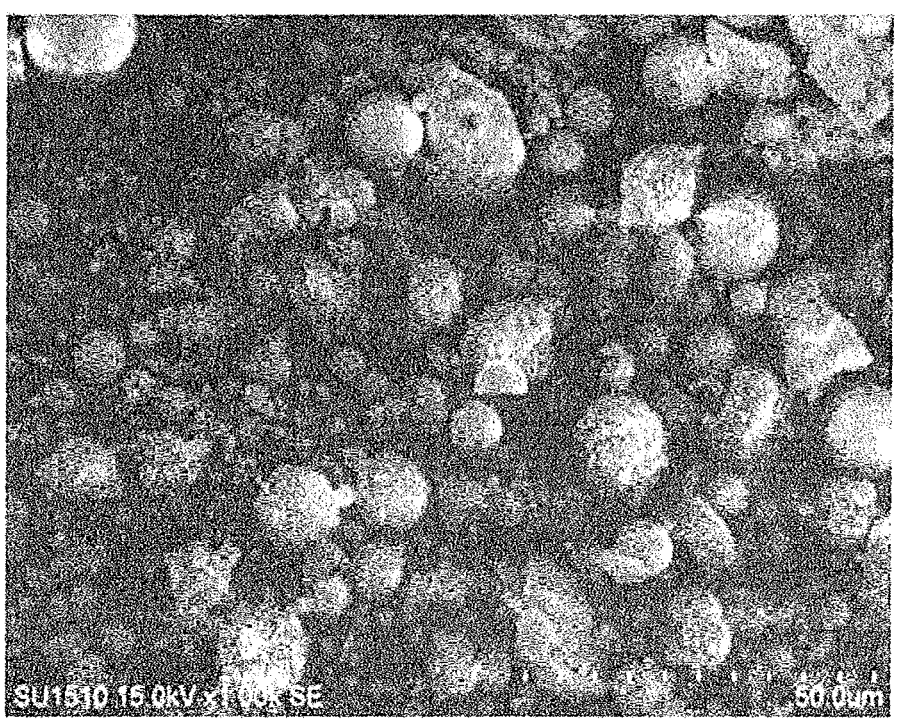

[FIG. 3]
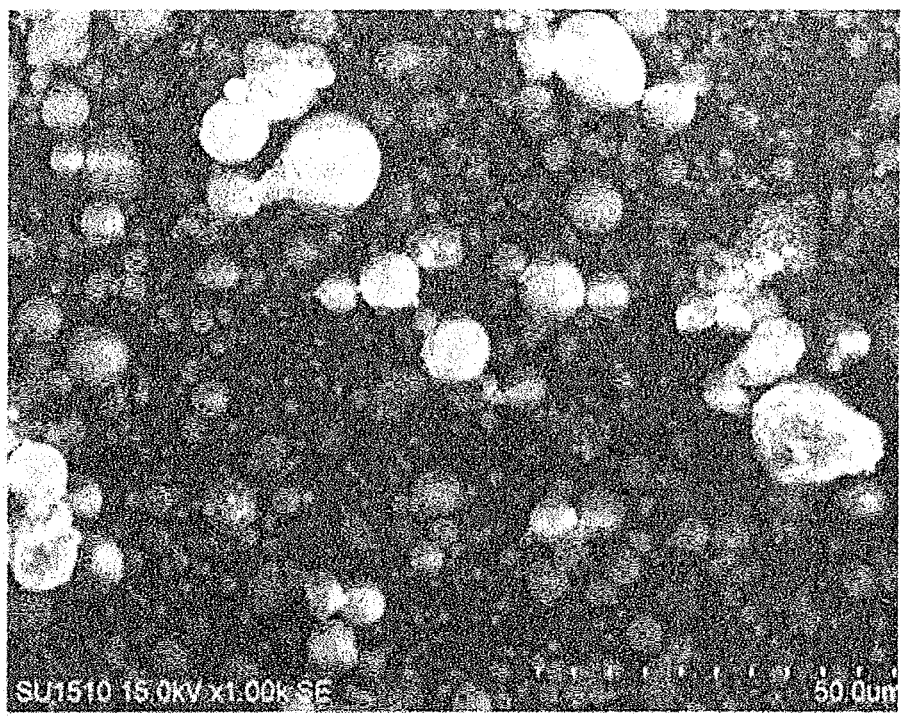
[FIG. 4]
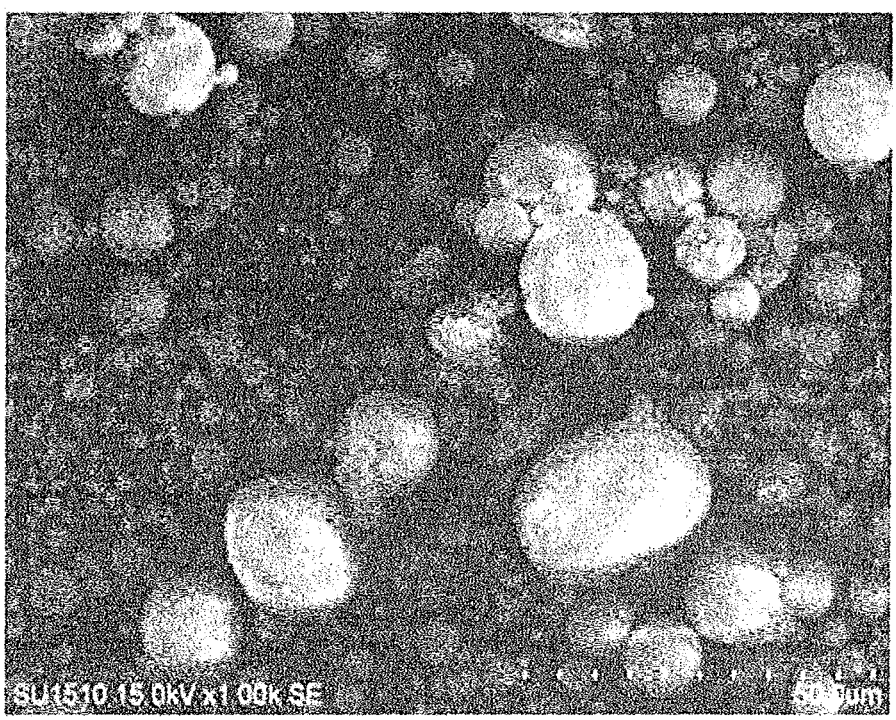

[FIG. 5]
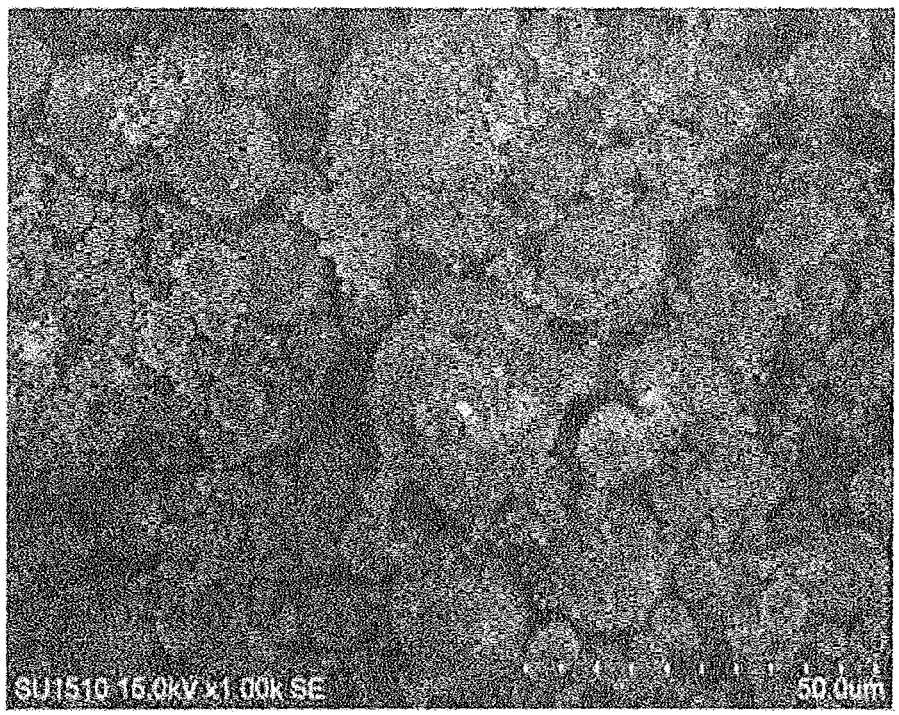
[FIG. 6]
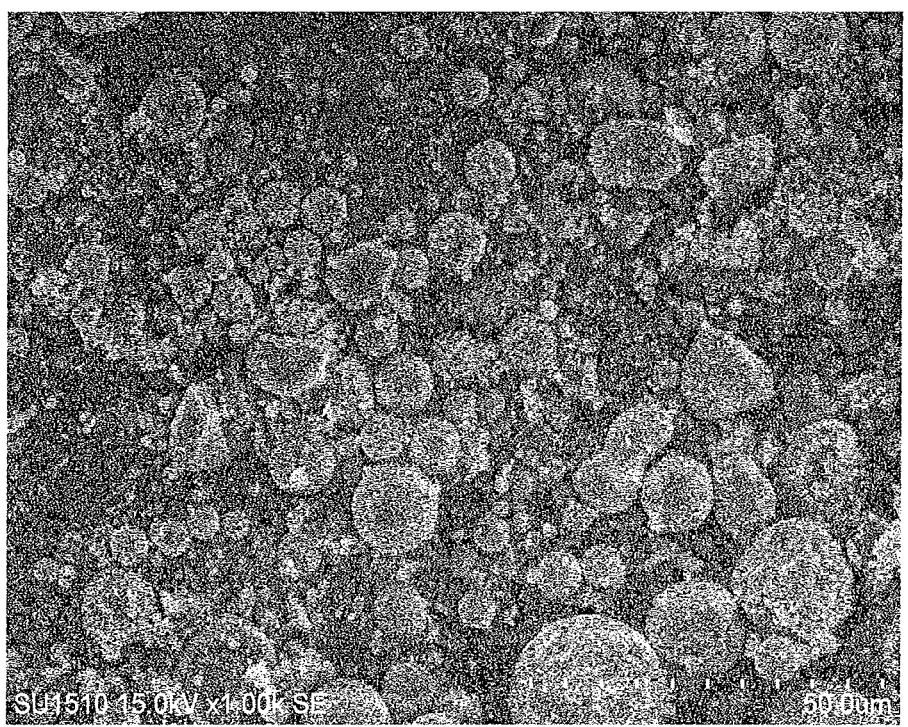

EPOXY RESIN COMPOSITION FOR SEALING SEMICONDUCTOR DEVICE, AND SEMICONDUCTOR DEVICE SEALED USING SAME

CROSS REFERENCE TO RELATED APPLICATIONS

This is the U.S. national phase application based on PCT/KR2017/001662, filed on Feb. 15, 2017, which is based on Korean Patent Application No. 10-2016-0076003, filed on Jun. 17, 2016, the entire contents of all of which are hereby incorporated by reference.

TECHNICAL FIELD

The present invention relates to an epoxy resin composition for encapsulation of semiconductor devices and a semiconductor device encapsulated using the same. More particularly, the present invention relates to an epoxy resin composition for encapsulation of semiconductor devices, which allows reduction in gel content in a composition for encapsulation of a semiconductor device to improve reliability of a semiconductor package without deterioration in formability and other properties, and a semiconductor device encapsulated using the same.

BACKGROUND ART

Recently, as the electronic device market has shifted to mobile devices represented by smartphones and tablets, technological development of electronic devices has focused on smaller, lighter and higher performance mobile devices. Accordingly, thinner and highly integrated semiconductor devices are developed in order to realize a high-performance, multifunctional, slimmer mobile device.

In order to achieve improvement in reliability of semiconductor devices together with the trend of slimness and high integration, various attempts have been made to realize good mechanical properties under severe conditions by adding nanoparticles to an encapsulation material used for packaging of semiconductor devices. However, encapsulation materials having been currently developed using nanoparticles are not suitable for mass production due to low formability despite good mechanical properties.

In order to solve such a problem, various methods, such as use of surfactants, surface treatment of nanoparticles using a coupling agent, and the like, are suggested in the art. However, use of large amounts of compounds such as a surfactant or a coupling agent can cause deterioration in properties of the encapsulation material.

Therefore, there is a need for development of a resin composition for encapsulation of semiconductor devices that can achieve good reliability under high temperature/humidity conditions while minimizing deterioration in formability and inherent properties thereof.

The background technique of the present invention is disclosed in Japanese Patent Registration No. 4618056.

DISCLOSURE

Technical Problem

It is an object of the present invention to provide a resin composition for encapsulation of semiconductor devices that can achieve good reliability under high temperature/humidity conditions while minimizing deterioration in inherent properties thereof.

It is another object of the present invention to provide a semiconductor device encapsulated using the resin composition for encapsulation of semiconductor devices.

It is a further object of the present invention to provide a method of preparing the resin composition for encapsulation of semiconductor devices.

Technical Solution

One aspect of the present invention provides an epoxy resin composition for encapsulation of semiconductor devices, which includes: an epoxy resin; a curing agent; an inorganic filler; and at least one additive selected from the group consisting of a curing accelerator, a coupling agent, a release agent, and a colorant, and has a gel content of about 1 ppm or less.

Gel particles contained in the epoxy resin composition may have a maximum size of about 1 mm or less.

The epoxy resin composition may include: about 0.1% by weight (wt %) to about 15 wt % of the epoxy resin; about 0.1 wt % to about 13 wt % of the curing agent; and about 70 wt % to about 95 wt % of the inorganic filler.

The epoxy resin composition may have a void generation rate of about 30% or less and voids generated in the epoxy resin composition may have a maximum size of about 50 μm or less, as measured after molding under conditions of a molding temperature of 175° C., a curing time of 120 seconds, a transfer time of 14 seconds, a transfer speed of 1.2 mm/sec, a clamp pressure of 40 ton, and a transfer pressure of 1 ton.

Another aspect of the present invention provides a semiconductor device encapsulated using the epoxy resin composition for encapsulation of semiconductor devices.

A further aspect of the present invention provides a method of preparing the epoxy resin composition for encapsulation of semiconductor devices, including: performing primary disintegration of a pre-mixture prepared by mixing an epoxy resin, a curing agent and inorganic fillers; forming a resin mixture by mixing the primarily disintegrated pre-mixture with at least one selected from the group consisting of a curing accelerator, a coupling agent, a release agent and a colorant; performing secondary disintegration of the resin mixture; and melt-kneading the secondarily disintegrated resin mixture.

The primary disintegration and the secondary disintegration may be performed using a jet-mill, a stone-mill, a colloid-mill or a hammer-mill, and the method may further include cooling and pulverizing the melt-kneaded resin mixture.

Advantageous Effects

The epoxy resin composition for encapsulation of semiconductor devices according to the present invention is prepared through a double-disintegration process and the content of fine gels in the epoxy resin composition is adjusted to about 1 ppm or less to prevent damage to components of a semiconductor device, such as wires, due to the gels upon molding of an encapsulation material while suppressing generation of defects such as voids, thereby improving reliability of a semiconductor package under high temperature/humidity conditions.

In addition, the epoxy resin composition for encapsulation of semiconductor devices according to the present invention has a very small amount of fine gels distributed therein, thereby effectively preventing deterioration in formability due to particle agglomeration.

DRAWINGS

FIG. 1 is a scanning electron microscope (SEM) image of an epoxy resin composition of Example 1.

FIG. 2 is a SEM image of an epoxy resin composition of Example 2.

FIG. 3 is a SEM image of an epoxy resin composition of Example 3.

FIG. 4 is a SEM image of an epoxy resin composition of Example 4.

FIG. 5 is a SEM image of an epoxy resin composition of Comparative Example 1.

FIG. 6 is a SEM image of an epoxy resin composition of Comparative Example 2.

BEST MODE

Hereinafter, embodiments of the present invention will be described in detail.

Detailed description of known functions and constructions which can unnecessarily obscure the subject matter of the present invention will be omitted.

As used herein, the terms "comprises," "comprising," "includes," and/or "including" specify the presence of stated features, integers, steps, operations, elements, components, and/or groups thereof, but do not preclude the presence or addition of other features, integers, steps, operations, elements, components, and/or groups thereof. In addition, the singular forms, "a," "an," and "the" are intended to include the plural forms as well, unless context clearly indicates otherwise.

Unless stated otherwise, a margin of error is considered in analysis of components.

Further, as used herein to represent a range of certain values, "X to Y" means "greater than or equal to X and less than or equal to Y".

As a result of intensive studies to develop an epoxy resin composition for encapsulation of semiconductor devices, which can secure good reliability under severe conditions, the present inventors developed the present invention based on the finding that the above and other objects can be achieved when the gel content in an epoxy resin composition prepared through a double-disintegration process is adjusted within a particular range.

Specifically, an epoxy resin composition for encapsulation of semiconductor devices according to the present invention includes an epoxy resin, a curing agent, an inorganic filler, and an additive, and has a gel content of about 1 ppm or less, preferably about 0.9 ppm or less, more preferably about 0.8 ppm or less, for example, 0.8 ppm, 0.7 ppm, 0.6 ppm, 0.5 ppm, 0.4 ppm, 0.3 ppm, 0.2 ppm, or 0.1 ppm.

Further, gel particles contained in the epoxy resin composition according to the present invention may have a maximum size of about 1 mm or less, preferably, about 0.8 mm or less, more preferably about 0.6 mm or less, for example, 0.6 mm, 0.5 mm, 0.4 mm, 0.3 mm, 0.2 mm, or 0.1 mm.

Herein, the gel content was calculated based on the weight of gel particles obtained through filtration under normal pressure through a 150 mesh filter after placing 200 g of the epoxy resin composition in 200 mL of acetone at 30° C., followed by stirring at 100 to 200 rpm for 10 minutes to dissolve the epoxy resin composition therein. In addition, the maximum size of the gel particles was measured by confirming the largest particles among the filtered gel particles through a high magnification microscope.

According to the studies of the present inventors, when the gel content in the epoxy resin composition satisfied the above range, the void generation rate after molding of an encapsulation material and the size of voids could be reduced and moisture infiltration could be effectively suppressed even under severe conditions, such as high temperature/humidity conditions, thereby securing good reliability. In addition, when the maximum size of gel particles was 1 mm or less, the epoxy resin composition could more effectively suppress generation of defects such as voids.

More specifically, the epoxy resin composition according to the present invention may have a void generation rate of about 30% or less, preferably about 20% or less, for example, 20%, 19%, 18%, 17%, 16%, 15%, 14%, 13%, 12%, 11%, 10%, 9%, 8%, 7%, 6%, 5%, 4%, 3%, 2%, or 1%, as measured after molding under conditions of a molding temperature of 175° C., a curing time of 120 seconds, a transfer time of 14 seconds, a transfer speed of 1.2 mm/sec, a clamp pressure of 40 ton, and a transfer pressure of 1 ton, and voids generated in the epoxy resin composition may have a maximum size of about 50 μm or less, preferably about 30 μm or less, for example, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, or 30 Herein, the void generation rate is a value obtained by dividing the number of cells having voids therein by 24 and multiplying the divided number by 100, when 24 cells are formed.

The epoxy resin composition for encapsulation of semiconductor devices according to the present invention includes: an epoxy resin, a curing agent, an inorganic filler, and at least one selected from the group consisting of a curing accelerator, a coupling agent, a release agent and a colorant.

Hereinafter, each component of the epoxy resin composition according to the present invention will be described in detail.

Epoxy Resin

The epoxy resin may include any suitable epoxy resin commonly used for encapsulation of semiconductor devices, without being limited to a particular resin. Specifically, the epoxy resin may be an epoxy compound having at least two epoxy groups per molecule. Examples of the epoxy resin may include epoxy resins obtained by epoxidation of a condensate of a phenol or an alkyl phenol and a hydroxybenzaldehyde, phenol novolac type epoxy resins, cresol novolac type epoxy resins, polyfunctional epoxy resins, naphthol novolac type epoxy resins, novolac type epoxy resins of bisphenol A/bisphenol F/bisphenol AD, glycidyl ethers of bisphenol A/bisphenol F/bisphenol AD, bishydroxybiphenyl epoxy resins, dicyclopentadiene epoxy resins, and the like. More specifically, the epoxy resin may include at least one of a cresol novolac type epoxy resin, a polyfunctional epoxy resin, a phenol aralkyl type epoxy resin, and a biphenyl type epoxy resin.

For example, the polyfunctional epoxy resin may be an epoxy resin represented by Formula 1.

[Formula 1]

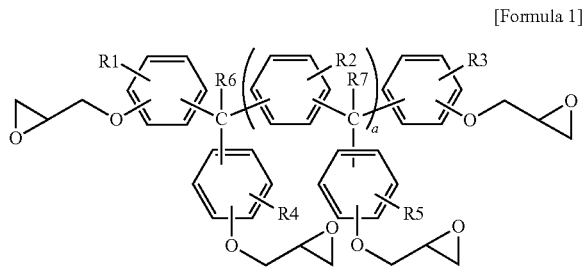

Advantageously, the phenol aralkyl type epoxy resin represented by Formula 2 has biphenyl units in the phenol backbone and thus exhibits good moisture absorption, toughness, oxidation resistance, and crack resistance. In addition, the phenol aralkyl type epoxy resin has low cross-linking density and thus forms a carbon layer (char) when burned at high temperature, thereby securing a certain degree of flame retardancy.

The biphenyl type epoxy resin may be, for example, a biphenyl type epoxy resin represented by Formula 3.

[Formula 3]

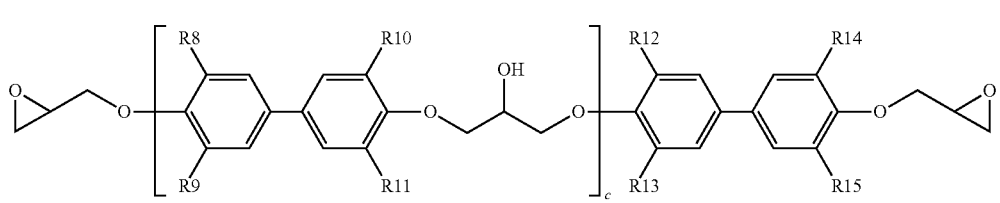

wherein R1, R2, R3, R4 and R5 are each independently a hydrogen atom or a $C_1$ to $C_4$ alkyl group, R6 and R7 are each independently a hydrogen atom, a methyl group, or an ethyl group, and a is an integer from 0 to 6. Specifically, R1, R2, R3, R4 and R5 may be each independently hydrogen, a methyl group, an ethyl group, a propyl group, an isopropyl group, an n-butyl group, an isobutyl group, a tert-butyl group, a pentyl group, or a hexyl group, and R6 and R7 may be hydrogen, without being limited thereto.

The polyfunctional epoxy resin represented by Formula 1 can reduce package deformation and has good properties in terms of fast curability, latency, and storage stability while exhibiting good post-curing strength and post-curing adhesion.

More specifically, the polyfunctional epoxy resin may be a triphenol alkane type epoxy resin, such as a triphenol methane type epoxy resin, a triphenol propane type epoxy resin, and the like.

The phenol aralkyl type epoxy resin epoxy resin may be, for example, a phenol aralkyl type epoxy resin having a novolac structure including a biphenyl derivative, as represented by Formula 2.

[Formula 2]

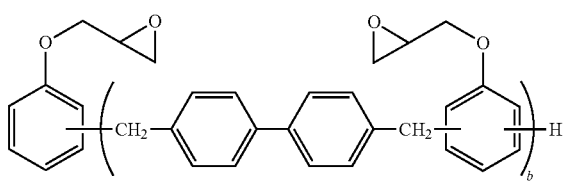

wherein b ranges from 1 to 7 on average.

wherein R8, R9, R10, R11, R12, R13, R14 and R15 are each independently a $C_1$ to $C_4$ alkyl group, and c ranges from 0 to 7 on average.

Advantageously, the biphenyl type epoxy resin represented by Formula 3 can enhance flowability and reliability of the resin composition.

These epoxy resins may be used alone or in combination thereof. In addition, the epoxy resin may be used in the form of adducts, such as a melt master batch, obtained by pre-reaction of the aforementioned epoxy resins with other components such as a curing agent, a curing accelerator, a release agent, a coupling agent, and a stress relief agent. Further, to improve moisture resistance reliability, the epoxy resin is preferably an epoxy resin containing a low amount of chlorine ions, sodium ions, and other ionic impurities.

The epoxy resin may be present in an amount of about 0.1 wt % to about 15 wt %, specifically about 3 wt % to about 15 wt %, more specifically about 3 wt % to about 12 wt %, for example, 3 wt %, 4 wt %, 5 wt %, 6 wt %, 7 wt %, 8 wt %, 9 wt %, 10 wt %, 11 wt %, or 12 wt %, in the epoxy resin composition. Within this range, the epoxy resin composition can exhibit good properties in terms of post-curing adhesion and post-curing strength.

Curing Agent

The curing agent may include any suitable curing agent commonly used for encapsulation of semiconductor devices, preferably a curing agent having at least two functional groups.

Specifically, the curing agent may include phenol compounds, such as phenol aralkyl type phenol resins, phenol novolac type phenol resins, xylok type phenol resins, cresol novolac type phenol resins, naphthol type phenol resins, terpene type phenol resins, polyfunctional phenol resins, dicyclopentadiene phenol resins, novolac type phenol resins prepared from bisphenol A and resol, tris(hydroxyphenyl) methane, and dihydroxybiphenyl, anhydrides, such as maleic anhydride and phthalic anhydride, and aromatic amines, such as metaphenylenediamine, diaminodiphenyl-methane, and diaminodiphenylsulfone, without being limited thereto.

For example, the curing agent may include at least one of a phenol novolac type phenol resin, a Xylok type phenol resin, a phenol aralkyl type phenol resin, and a polyfunctional phenol resin.

The phenol novolac type phenol resin may be, for example, a phenol novolac type phenol resin represented by Formula 4.

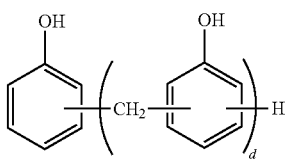

[Formula 4]

wherein d ranges from 1 to 7.

The phenol novolac type phenol resin represented by Formula 4 has crosslink points spaced at short intervals and thus exhibits high crosslinking density upon reaction with the epoxy resin. As a result, a cured product thereof can exhibit increased glass transition temperature and thus reduced coefficient of linear expansion, thereby suppressing warpage of a semiconductor device package.

The phenol aralkyl type phenol resin may be, for example, a phenol aralkyl type phenol resin of a novolac structure containing a biphenyl derivative, as represented by Formula 5.

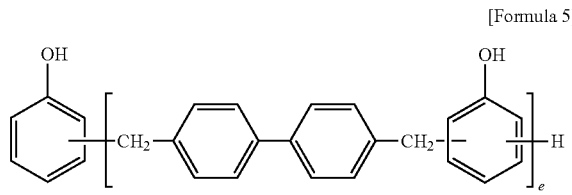

[Formula 5]

wherein e ranges from 1 to 7 on average.

The phenol aralkyl type phenol resin represented by Formula 5 reacts with the epoxy resin to form a carbon layer (char) blocking heat and oxygen in a surrounding environment, thereby providing flame retardancy.

The Xylok type phenol resin may be, for example, a Xylok type phenol resin represented by Formula 6.

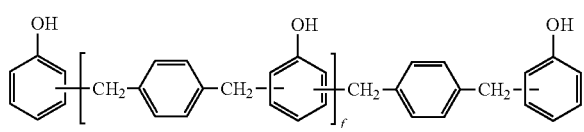

[Formula 6]

wherein f ranges from 0 to 7 on average.

The Xylok type phenol resin represented by Formula 6 can advantageously enhance flowability and reliability of the resin composition.

The polyfunctional phenol resin may be, for example, a polyfunctional phenol resin containing a repeat unit represented by Formula 7.

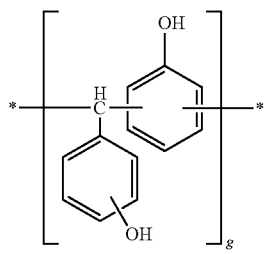

[Formula 7]

wherein g ranges from 1 to 7 on average.

The polyfunctional phenol resin containing a repeat unit represented by Formula 7 can advantageously enhance flexural properties at high temperature of the epoxy resin composition.

These curing agents may be used alone or in combination thereof. In addition, the curing agent may be used in the form of adducts, such as a melt master batch, obtained by pre-reacting the above curing agents with other components such as the epoxy resin, a curing accelerator, a release agent, a coupling agent, and a stress relief agent.

The curing agent may be present in an amount of about 0.1 wt % to about 13 wt %, specifically about 0.1 wt % to about 10 wt %, more specifically about 0.1 wt % to about 8 wt %, in the epoxy resin composition. Within this range, the epoxy resin composition can exhibit good properties in terms of degree of curing and post-curing strength.

A mixing ratio of the epoxy resin to the curing agent may be adjusted according to mechanical properties and moisture resistance reliability required for a semiconductor device package. For example, a chemical equivalent ratio of the epoxy resin to the curing agent may range from about 0.95 to about 3, specifically from about 1 to about 2, more specifically from 1 to about 1.75, for example 1, 1.05, 1.1, 1.15, 1.2, 1.25, 1.3, 1.35, 1.4, 1.45, 1.5, 1.55, 1.6, 1.65, 1.7, or 1.75. Within this range, the epoxy resin composition can exhibit good post-curing strength.

Inorganic Filler

The inorganic filler serves to improve mechanical properties of the epoxy resin composition while securing low stress thereof. The inorganic fillers may include any suitable inorganic fillers commonly used in semiconductor encapsulants, without limitation. For example, the inorganic fillers may include fused silica, crystalline silica, calcium carbonate, magnesium carbonate, alumina, magnesia, clay, talc, calcium silicate, titanium oxide, antimony oxide, and glass fiber. These may be used alone or in combination thereof.

Preferably, fused silica having a low coefficient of linear expansion is used to reduce stress. Fused silica refers to amorphous silica having a true specific gravity of about 2.3 or less and may be produced by melting crystalline silica or may include amorphous silica prepared from various materials. Although the shape and particle diameter of the fused silica are not particularly limited, it is desirable that a mixture of about 50 wt % to about 99 wt % of spherical fused silica having an average particle diameter of about 5 μm to about 30 μm and about 1 wt % to about 50 wt % of spherical fused silica having an average particle diameter of about 0.001 to about 1 μm be present in an amount of about 40 wt % to about 100 wt % based on the total amount of the inorganic fillers. In addition, the maximum particle diameter of the fused silica may be adjusted to any one of about 45 μm, about 55 μm, and about 75 μm depending upon desired use of the resin composition. Although the spherical fused silica may include conductive carbon as a foreign substance on the surface thereof, it is important to select a material having less polar foreign substances therein.

The amount of the inorganic filler varies depending upon required properties, such as moldability, low stress, and strength at high temperature. In one embodiment, the inorganic filler may be present in an amount of about 70 wt % to about 95 wt %, for example, about 80 wt % to about 90 wt % or about 83 wt % to about 97 wt %, for example, 83 wt %, 84 wt %, 85 wt %, 86 wt %, 87 wt %, 88, 89 wt %, 90 wt %, 91 wt %, 92 wt %, 93 wt %, 94 wt %, 95 wt %, 96 wt %, or 97 wt %, in the epoxy resin composition. Within this range of the inorganic filler, the epoxy resin composition can secure flame retardancy, flowability and reliability.

Additives

The epoxy resin composition according to the present invention may further include at least one selected from the group consisting of a curing accelerator, a coupling agent, a release agent and a colorant.

Curing Accelerator

The curing accelerator serves to promote reaction between the epoxy resin and the curing agent. Examples of the curing accelerator may include tertiary amines, organometallic compounds, organophosphorus compounds, imidazole compounds, boron compounds, and the like. Examples of the tertiary amines may include benzyldimethylamine, triethanolamine, triethylenediamine, diethylaminoethanol, tri(dimethylaminomethyl)phenol, 2-2-(dimethylaminomethyl)phenol, 2,4,6-tris(diaminomethyl)phenol, and salts of tri-2-ethylhexanoic acid.

Examples of the organometallic compounds may include chromium acetylacetonate, zinc acetylacetonate, and nickel acetylacetonate. Examples of the organophosphorus compounds may include tris(4-methoxy)phosphine, tetrabutylphosphonium bromide, tetraphenylphosphonium bromide, phenylphosphine, diphenylphosphine, triphenylphosphine, triphenylphosphine triphenylborane, and triphenylphosphine-1,4-benzoquinone adducts. Examples of the imidazole compounds may include 2-phenyl-4-methylimidazole, 2-methylimidazole, 2-phenylimidazole, 2-aminoimidazole, 2-methyl-1-vinylimidazole, 2-ethyl-4-methylimidazole, and 2-heptadecylimidazole, without being limited thereto. Examples of the boron compounds may include tetraphenylphosphonium-tetraphenylborate, triphenylphosphine tetraphenylborate, tetraphenylboron salts, trifluoroborane-n-hexylamine, trifluoroborane monoethylamine, tetrafluoroborane triethylamine, and tetrafluoroborane amine. In addition, 1,5-diazabicyclo[4.3.0]non-5-ene (DBN), 1,8-diazabicyclo[5.4.0]undec-7-ene (DBU), and phenol novolac resin salts may be used, without being limited thereto.

More specifically, these organophosphorus compounds, boron compounds, amine compounds, or imidazole compounds may be used alone or in combination thereof as the curing accelerator. The curing accelerator may be used in the form of adducts obtained by pre-reacting these compounds with the epoxy resin or the curing agent.

The curing accelerator may be present in an amount of about 0.01 wt % to about 2 wt %, specifically about 0.02 wt % to about 1.5 wt %, more specifically about 0.05 wt % to about 1 wt %, for example, 0.05 wt %, 0.1 wt %, 0.2 wt %, 0.3 wt %, 0.4 wt %, 0.5 wt %, 0.6 wt %, 0.7 wt %, 0.8 wt %, 0.9 wt %, or 1.0 wt %, based on the total weight of the epoxy resin composition. Within this range, the curing accelerator can promote curing of the epoxy resin composition while securing good degree of curing.

Coupling Agent

The coupling agent serves to improve interfacial strength between the epoxy resin and the inorganic filler and may include, for example, a silane coupling agent. The silane coupling agent may be selected from any silane coupling agents used in the art so long as the silane coupling agent can react between the epoxy resin and the inorganic filler to improve interfacial strength therebetween. Examples of the silane coupling agent include epoxysilane, aminosilane, ureidosilane, and mercaptosilane. These coupling agents may be used alone or in combination thereof.

The coupling agent may be present in an amount of about 0.01 wt % to about 5 wt %, specifically about 0.05 wt % to about 3 wt %, more specifically about 0.1 wt % to about 2 wt %, for example, 0.1 wt %, 0.2 wt %, 0.3 wt %, 0.4 wt %, 0.5 wt %, 0.6 wt %, 0.7 wt %, 0.8 wt %, 0.9 wt %, 1.0 wt %, 1.1 wt %, 1.2 wt %, 1.3 wt %, 1.4 wt %, 1.5 wt %, 1.6 wt %, 1.7 wt %, 1.8 wt %, 1.9 wt %, or 2.0 wt %, based on the total amount of the epoxy resin composition. Within this range, the coupling agent increases strength of a cured product formed of the epoxy resin composition.

Release Agent

The release agent may include at least one selected from the group consisting of paraffin wax, ester wax, higher fatty acids, higher fatty acid metal salts, natural fatty acids, and natural fatty acid metal salts.

The release agent may be present in an amount of about 0.1 wt % to about 1 wt %, for example, 0.1 wt %, 0.2 wt %, 0.3 wt %, 0.4 wt %, 0.5 wt %, 0.6 wt %, 0.7 wt %, 0.8 wt %, 0.9 wt %, or 1.0 wt %, in the epoxy resin composition.

Colorant

The colorant is provided for laser marking of an encapsulation material of a semiconductor device and may be selected from typical colorants used in the related art. For example, the colorant may include at least one of carbon black, titanium black, titanium nitride, dicopper hydroxide phosphate, iron oxide, and mica.

The colorant may be present in an amount of about 0.01 wt % to about 5 wt %, preferably about 0.05 wt % to about 3 wt %, more preferably about 0.1 wt % to about 2 wt %, for example 0.1 wt %, 0.2 wt %, 0.3 wt %, 0.4 wt %, 0.5 wt %, 0.6 wt %, 0.7 wt %, 0.8 wt %, 0.9 wt %, 1.0 wt %, 1.1 wt %, 1.2 wt %, 1.3 wt %, 1.4 wt %, 1.5 wt %, 1.6 wt %, 1.7 wt %, 1.8 wt %, 1.9 wt %, or 2.0 wt %, based on the total amount of the epoxy resin composition.

In addition, the epoxy resin composition may further include stress release agents, such as modified silicone oil, silicone powder, and silicone resin; antioxidants, such as tetrakis[methylene-3-(3,5-di-tert-butyl-4-hydroxyphenyl) propionate]methane, and the like so as not to have an adverse effect on the object of the present invention, as needed.

Method of Preparing Epoxy Resin Composition

Next, a method of preparing the epoxy resin composition according to the present invention will be described.

The method of preparing the epoxy resin composition according to the present invention includes: performing primary disintegration of a pre-mixture prepared by mixing an epoxy resin, a curing agent and inorganic fillers; forming a resin mixture by mixing the primarily disintegrated pre-mixture with at least one selected from the group consisting of a curing accelerator, a coupling agent, a release agent and a colorant; performing secondary disintegration of the resin mixture; and melt-kneading the secondarily disintegrated resin mixture.

First, the pre-mixture is prepared by mixing the epoxy resin, the curing agent and the inorganic fillers, and is then disintegrated (primary disintegration). Here, the method of mixing the epoxy resin, the curing agent and the inorganic fillers may be performed by a typical mixing method well-known to those skilled in the art using, for example, a Henschel mixer or a Lodige mixer, without being limited thereto. The primary disintegration may be performed by various milling methods typically used in the art using a jet-mill, a stone-mill, a colloid-mill or a hammer-mill, preferably a jet mill. Advantageously, the jet mill can facilitate application of a continuous process and other milling methods can minimize weight loss in the disintegration process. Primary disintegration in the jet mill may be performed under conditions of about 0.3 MPa to about 1.0 MPa.

After the primary disintegration is completed, at least one additive selected from the group consisting of a curing accelerator, a coupling agent, a release agent and a colorant is added to the primarily disintegrated mixture to form a resin mixture. Here, the method of mixing the primarily disintegrated mixture with the additive may be performed by a typical mixing method well-known to those skilled in the art using, for example, a Henschel mixer or a Lodige mixer, without being limited thereto.

Thereafter, the resin mixture is disintegrated (secondary disintegration). Like the primary disintegration, the secondary disintegration may be performed by various milling methods typically used in the art using a jet-mill, a stone-mill, a colloid-mill or a hammer-mill, preferably a jet mill. Advantageously, the jet mill can facilitate application of a continuous process and other milling methods can minimize weight loss in the disintegration process. Primary disintegration in the jet mill may be performed under conditions of about 0.3 MPa to about 1.0 MPa.

Thereafter, the secondarily disintegrated resin mixture is melt-kneaded. Here, melt-kneading may be performed using a roll-mill or a kneader, without being limited thereto. After melt-kneading, the method may further include cooling and pulverizing the melt-kneaded resin mixture.

Through two disintegration processes as in the preparation method according to the present invention, it is possible to prepare an epoxy resin composition having a gel content of about 1 ppm or less.

As a method for encapsulating a semiconductor device with the epoxy resin composition, low-pressure transfer molding may be used. Alternatively, injection molding or casting may also be used for molding of the epoxy resin composition.

1.

2. [Mode for Invention]

Next, the present invention will be described in more detail with reference to some examples. It should be understood that these examples are provided for illustration only and are not to be in any way construed as limiting the present invention.

Descriptions of details apparent to those skilled in the art will be omitted for clarity.

EXAMPLE

Details of the components used in Examples and Comparative Examples are as follows.

(A) Epoxy resin (a1) Phenol aralkyl type epoxy resin: NC-3000 (Nippon Kayaku Co., Ltd.) was used.

(a2) Biphenyl type epoxy resin: YX-4000 (Japan Epoxy Resin Co., Ltd.) was used.

(B) Curing agent (b1) A Xyloc type phenol resin (KPH-F3065, Kolong Industries Inc.) was used.

(b2) A phenol aralkyl type phenol resin (MEH-7851, Meiwa Co., Ltd.) was used.

(C) Curing accelerator (c1) TPP-k (triphenylphosphine, Hokko Chemical Co., Ltd.) was used.

(c2) 1,4-benzoquinone (Aldrich GmbH) was used.

(D) Inorganic filler: A mixture of spherical fused silica having an average particle diameter of 20 μm and spherical fused silica having an average particle diameter of 0.5 μm (in a weight ratio of 9:1) was used.

(E) Coupling agent (e1) A mercaptopropyltrimethoxy silane coupling agent (KBM-803, Shin-Etsu Chemical Co., Ltd.) was used.

(e2) A methyltrimethoxy silane coupling agent (SZ-6070, Dow-Corning Co., Ltd.) was used.

(e3) An N-phenyl-3-aminopropyltrimethoxy silane coupling agent (KBM-573, Shin-Etsu Chemical Co., Ltd.) was used.

(F) Colorant: Carbon black (MA-600B, Mitsubishi Chemical Co., Ltd.) was used.

Examples 1 to 4

The epoxy resin (A), the curing agent (B), and the inorganic filler (D) were weighed as listed in Table 1 and uniformly mixed at 25° C. to 30° C. for 30 minutes using a Henschel mixer (KSM-22, Keumsung Machinery Co. Ltd.) to prepare a pre-mixture, followed by primarily disintegrating the pre-mixture using a jet mill. Then, the curing accelerator (C), the coupling agent (E) and the colorant (F) were added in amounts as listed in Table 1 to the primarily disintegrated pre-mixture and then uniformly mixed therewith at 25° C. to 30° C. for 30 minutes using a Henschel mixer (KSM-22, Keumsung Machinery Co. Ltd.) to prepare a resin composition, followed by secondarily disintegrating the resin composition using a jet mill. Thereafter, the secondarily disintegrated resin composition was subjected to melt-kneading in a kneader at 110° C. (Max.) for 30 minutes, followed by cooling to 10° C. to 15° C. and pulverizing, thereby preparing an epoxy resin composition for encapsulation of semiconductor devices.

Comparative Examples 1 and 2

The epoxy resin (A), the curing agent (B), the curing accelerator (C), the inorganic fillers (D), the coupling agent (E) and the colorant (F) were weighed as listed in Table 1 and uniformly mixed at 25° C. to 30° C. for 30 minutes using a Henschel mixer (KSM-22, Keumsung Machinery Co. Ltd.) and melt-kneaded using a continuous kneader at 110° C. (Max.) for 30 minutes, followed by cooling to 10° C. to 15° C. and pulverizing, thereby preparing epoxy resin compositions for encapsulation of semiconductor devices.

TABLE 1

|  | Example 1 | Example 2 | Example 3 | Example 4 | Comparative Example 1 | Comparative Example 2 |
|---|---|---|---|---|---|---|
| (A) (a1) | 7.0 | 6.5 | 4.0 | 3.0 | 8.0 | 6.5 |
| (A) (a2) | 2.6 | 2.1 | 1.7 | 1.4 | 3.0 | 2.1 |
| (B) (b1) | 1.5 | 1.0 | 0.7 | 0.4 | 1.8 | 1.5 |
| (B) (b2) | 2.4 | 1.9 | 1.1 | 0.7 | 2.7 | 2.4 |
| (C) (c1) | 0.2 | 0.1 | 0.2 | 0.1 | 0.2 | 0.1 |
| (C) (c2) | — | 0.1 | — | 0.1 | — | 0.1 |

TABLE 1-continued

|  | Example 1 | Example 2 | Example 3 | Example 4 | Comparative Example 1 | Comparative Example 2 |
|---|---|---|---|---|---|---|
| (D) | 85 | 87 | 91 | 93 | 83 | 86 |
| (E) (e1) | 0.2 | 0.2 | 0.2 | 0.2 | 0.2 | 0.2 |
| (E) (e2) | 0.3 | 0.3 | 0.3 | 0.3 | 0.3 | 0.3 |
| (E) (e3) | 0.3 | 0.3 | 0.3 | 0.3 | 0.3 | 0.3 |
| (F) | 0.5 | 0.5 | 0.5 | 0.5 | 0.5 | 0.5 |

[Unit: parts by weight]

The epoxy resin compositions prepared in Examples and Comparative Examples were evaluated as to the following properties. Evaluation results are shown in FIGS. 1 to 6 and Table 2.

Property Evaluation (1) Evaluation of Dispersion

The degrees of dispersion were compared after photographing the epoxy resin compositions of Examples and Comparative Examples using a scanning electronic microscope (SEM). An SEM-3010 (JEOL, US) was used and the obtained pictures are shown in FIG. 1 to FIG. 6.

(2) Gel Content (%) and Maximum Particle Size of Gel Particles (mm)

200 g of each of the epoxy resin compositions prepared in Examples and Comparative Examples was taken five times from each batch, subjected to melt-kneading at 100 to 200 rpm in 200 ml acetone (purity: 99.9%) at 30° C. for 10 minutes, and filtered through a 150 mesh filter under normal pressure. Then, the weight of the filtered gel particles was measured. The gel content was defined as a value obtained by dividing the measured weight by 200 g and multiplying the divided weight by 100.

In addition, the maximum particle size (mm) of gel particles was measured by confirming the diameter of the largest gel particle among the filtered gel particles using a high magnification microscope.

(3) Void Generation Rate (%) and Void Size (μm)

Void generation rate was evaluated by counting the number of cells having voids therein among cells (total number: 24) of molded products obtained by molding the epoxy resin compositions using an NGF (Narrow Gap Filling) mold, and the size of voids was evaluated by measuring the diameter of the largest void using a high magnification microscope.

On the other hand, molding of the epoxy resin composition was performed under conditions of a molding temperature of 175° C., a curing time of 120 seconds, a transfer time of 14 seconds, a transfer speed of 1.2 mm/sec, a clamp pressure of 40 ton, and a transfer pressure of 1 ton.

(4) Reliability Evaluation (Number, %)

200 semiconductor packages manufactured by encapsulating semiconductor devices using the epoxy resin compositions prepared in Examples and Comparative Examples were exposed to conditions of 130° C. and 85% RH for 168 hours, followed by repeating IR reflow at 260° C. for 30 seconds three times. Thereafter, the number of semiconductor packages suffering from delamination was measured. Generation of delamination was evaluated through non-destructive C-SAM (Scanning Acoustic Microscopy) and optical microscopy.

TABLE 2

|  | Gel content (ppm) | Maximum size of gel particles (mm) | Void generation rate [% (number)] | Maximum size of voids [μm] | Reliability [Number of semiconductor packages suffering from delamination (%)] |
|---|---|---|---|---|---|
| Example 1 | 0.8 | 0.4 | 13 (3/24) | 23 | 0 |
| Example 2 | 0.6 | 0.6 | 13 (3/24) | 25 | 0 |
| Example 3 | 0.03 | 0.3 | 13 (3/24) | 21 | 0 |
| Example 4 | 0.95 | 0.6 | 17 (4/24) | 19 | 0 |
| Comparative Example 1 | 5.6 | 1.4 | 33 (8/24) | 58 | 84 (42%) |
| Comparative Example 2 | 7.65 | 1.9 | 42 (10/24) | 164 | 71 (36%) |

From Table 2, it could be seen that the epoxy resin compositions of Examples 1 to 4 had better reliability, a lower void generation rate and a lower maximum void size than the epoxy resin compositions of Comparative Examples 1 and 2.

In addition, from FIG. 1 to FIG. 6, it could be seen that the epoxy resin compositions of Examples 1 to 4 allowed less particle agglomeration than the epoxy resin compositions of Comparative Examples 1 and 2.

The invention claimed is:

1. An epoxy resin composition for encapsulation of semiconductor devices, comprising: an epoxy resin; a curing agent; an inorganic filler; and at least one additive selected from the group consisting of a curing accelerator, a coupling agent, a release agent and a colorant, the epoxy resin composition having a gel content of about 1 ppm or less.

2. The epoxy resin composition according to claim 1, wherein gel particles contained in the epoxy resin composition have a maximum size of about 1 mm or less.

3. The epoxy resin composition according to claim 2, wherein:
the epoxy resin composition has a gel content of 0.03 ppm to 1 ppm,
the gel particles contained in the epoxy resin composition have a maximum size of 0.3 mm to 1 mm.

4. The epoxy resin composition according to claim 1, comprising: about 0.1 wt % to about 15 wt % of the epoxy resin; about 0.1 wt % to about 13 wt % of the curing agent; and about 70 wt % to about 95 wt % of the inorganic filler.

5. The epoxy resin composition according to claim 1, wherein the epoxy resin composition has a void generation rate of about 30% or less, as measured after molding under conditions of a molding temperature of 175° C., a curing time of 120 seconds, a transfer time of 14 seconds, a transfer speed of 1.2 mm/sec, a clamp pressure of 40 ton, and a transfer pressure of 1 ton.

6. The epoxy resin composition according to claim 1, wherein voids generated in the epoxy resin composition have a maximum size of about 50 µm or less after molding under conditions of a molding temperature of 175° C., a curing time of 120 seconds, a transfer time of 14 seconds, a transfer speed of 1.2 mm/sec, a clamp pressure of 40 ton, and a transfer pressure of 1 ton.

7. A semiconductor device encapsulated by the epoxy resin composition according to claim 1.

8. A method of preparing the epoxy resin composition for encapsulation of semiconductor devices as claimed in claim 1, the method comprising:
performing primary disintegration of a pre-mixture prepared by mixing the epoxy resin, and the inorganic filler;
forming a resin mixture by mixing the primarily disintegrated pre-mixture with the curing accelerator, the coupling agent, the release agent, or the colorant;
performing secondary disintegration of the resin mixture; and
melt-kneading the secondarily disintegrated resin mixture.

9. The method according to claim 8, wherein the primary disintegration and the secondary disintegration are performed using a jet-mill, a stone-mill, a colloid-mill or a hammer-mill.

10. The method according to claim 8, further comprising: cooling and pulverizing the melt-kneaded resin mixture.

11. The epoxy resin composition according to claim 1, wherein the composition is prepared by a method of preparing an epoxy resin composition for encapsulation of semiconductor devices that includes:
performing primary disintegration of a pre-mixture prepared by mixing the epoxy resin and the inorganic filler;
forming a resin mixture by mixing the primarily disintegrated pre-mixture with the curing accelerator, the coupling agent, the release agent, or the colorant;
performing secondary disintegration of the resin mixture; and
melt-kneading the secondarily disintegrated resin mixture.

* * * * *